(12) United States Patent
Fanton et al.

(10) Patent No.: US 8,932,436 B2
(45) Date of Patent: Jan. 13, 2015

(54) NON-STOICHIOMETRIC NIOX CERAMIC TARGET

(75) Inventors: Xavier Fanton, Bois (FR); Jean-Christophe Giron, Aachen (DE)

(73) Assignee: Saint-Gobain Glass France, Courbevoie (FR)

( * ) Notice: Subject to any disclaimer, the term of this patent is extended or adjusted under 35 U.S.C. 154(b) by 1174 days.

(21) Appl. No.: 10/502,052

(22) PCT Filed: Feb. 4, 2003

(86) PCT No.: PCT/FR03/00340
§ 371 (c)(1),
(2), (4) Date: Jan. 7, 2005

(87) PCT Pub. No.: WO03/066928
PCT Pub. Date: Aug. 14, 2003

(65) Prior Publication Data
US 2005/0115828 A1    Jun. 2, 2005

(30) Foreign Application Priority Data
Feb. 6, 2002  (FR) ..................... 02 01528

(51) Int. Cl.
*C23C 14/34* (2006.01)
*G02F 1/15* (2006.01)
*C04B 35/01* (2006.01)
(Continued)

(52) U.S. Cl.
CPC .............. *G02F 1/1523* (2013.01); *C23C 14/35* (2013.01); *C04B 35/01* (2013.01); *C04B 2235/3279* (2013.01); *C04B 2235/405* (2013.01); *C04B 2235/652* (2013.01); *C04B 2235/6584* (2013.01); *C04B 2235/79* (2013.01); *C04B 2235/96* (2013.01); *C23C 14/085* (2013.01);
(Continued)

(58) Field of Classification Search
CPC .... C23C 14/3414; C23C 14/085; C23C 14/35
USPC .............. 204/298.12, 298.13, 192.1, 192.12, 204/192.15, 192.26
See application file for complete search history.

(56) References Cited

U.S. PATENT DOCUMENTS 3,860,507 A  *  1/1975  Vossen, Jr. ............... 204/192.12
4,107,019 A      8/1978  Takao et al.
(Continued)

FOREIGN PATENT DOCUMENTS

FR    2 793 888        11/2000
JP    62297451 A  *   12/1987
JP    01-256036       10/1989

OTHER PUBLICATIONS

IBM Technical Disclosure: Thermally Stable Thin Film Capacitor published Feb. 1, 1967.*
(Continued)

*Primary Examiner* — John Brayton
(74) *Attorney, Agent, or Firm* — Oblon, Spivak, McClelland, Maier & Neustadt, L.L.P.

(57) ABSTRACT

The subject of the invention is an essentially ceramic target for a sputtering device, especially for magnetically enhanced sputtering, said target comprising predominantly nickel oxide, the nickel oxide $NiO_x$ being oxygen-deficient with respect to the stoichiometric composition.

22 Claims, 2 Drawing Sheets

(51) Int. Cl.
*C23C 14/08* (2006.01)
*G02F 1/01* (2006.01)
*C23C 14/35* (2006.01)

(52) U.S. Cl.
CPC ............ *C23C14/3414* (2013.01); *G02F 1/011* (2013.01); *Y02T 50/67* (2013.01)
USPC ............ 204/192.15; 204/192.12; 204/192.17; 204/192.26; 204/298.13

(56) References Cited

U.S. PATENT DOCUMENTS

| | | | | |
|---|---|---|---|---|
| 4,832,468 | A | * | 5/1989 | Ito et al. .................. 359/275 |
| 4,961,979 | A | * | 10/1990 | Iida et al. ................. 428/65.2 |
| 5,483,067 | A | * | 1/1996 | Fujii et al. ................ 250/338.3 |
| 5,522,976 | A | * | 6/1996 | Campet et al. ........... 204/298.13 |
| 5,708,523 | A | * | 1/1998 | Kubo et al. .................. 359/269 |
| 5,831,760 | A | * | 11/1998 | Hashimoto et al. ........... 359/273 |
| 5,905,590 | A | * | 5/1999 | Van Der Sluis et al. ...... 359/275 |
| 5,981,092 | A | | 11/1999 | Arai et al. |
| 6,193,856 | B1 | * | 2/2001 | Kida et al. ............... 204/192.22 |
| 6,277,523 | B1 | * | 8/2001 | Giron ........................ 429/304 |
| 6,521,098 | B1 | * | 2/2003 | Lin et al. ................. 204/192.11 |

OTHER PUBLICATIONS

Translation to Narita, Yuji et al. (JP 62-297451 cited on Office Action Sep. 16, 2011) published Dec. 1987.*

S. J. Wen, et al., "Analysis of durability in lithium nickel oxide electrochromic materials and devices, Solar Energy Materials and Solar Cells", vol. 56, No. 3-4, pp. 299-307 1999.

M. Rubin, et al., "Electrochromin lithium nickel oxide by pulsed laser deposition and sputtering", Solar Energy Materials and Solar Cells, vol. 54, No. 1-4, pp. 59-66 1998.

* cited by examiner

NON-STOICHIOMETRIC NIOX CERAMIC TARGET

The present invention relates to an essentially ceramic target intended to be used for depositing films within a sputtering device, especially for magnetically enhanced sputtering, and to the use of this target.

More specifically, the aim of the invention is to provide a ceramic target made of nickel and a process for depositing layers or films of nickel oxide or alloys of nickel oxide from this target by magnetron sputtering in DC or pulsed mode.

Nickel oxide films are commonly employed in several types of application. Thus, for example, they are encountered in electrochromic devices, in photovoltaic devices (U.S. Pat. Nos. 4,892,594 and 5,614,727) or in recording devices (JP 02056747).

Such nickel oxide films are deposited in a known manner on a substrate by sol-gel using suitable precursors, or by electrode position using aqueous solutions of nickel salts.

When the nickel oxide films are incorporated into electrochromic devices of the all-solid-state type, one method of depositing them is by reactive magnetron sputtering. All the thin layers are then deposited by reactive magnetron sputtering with no break in the process.

When these nickel oxide films are used within electrochromic devices as anodic coloration material, it is known that the electrical and light characteristics of these films depend strongly on their stoichiometry, and it is desirable for this to be finely controlled so as to optimize the functionality of the complete device: The contrast and the optical properties in the bleached state and in the colored state depend on the characteristics of the nickel oxide layer.

In known electrochromic devices, the nickel oxide films are deposited by reactive sputtering from a nickel metal target in an argon/oxygen or argon/oxygen/hydrogen atmosphere.

In this method of production, a hysteresis phenomenon occurs with a discontinuity in the rate of deposition and the discharge voltage or current as a function of the oxygen concentration in the chamber. When the amount of oxygen is small, the film is absorbent and metallic in character. The switch in oxide mode occurs above a given amount of oxygen that depends on the operating conditions (working pressure, surface power, etc.). When nickel oxide films are deposited by reactive magnetron sputtering from nickel metal targets, the films are overoxidized with respect to the stoichiometric compound. The oxidation state of certain Ni atoms is then higher ($Ni^{III}$ instead of $Ni^{II}$), and the film is brown. Deposition by reactive magnetron sputtering from metal targets does not allow the stoichiometry of the deposited film to be easily controlled.

A first method for controlling the stoichiometry of the deposited films was developed, this consisting in depositing the films from sintered nickel oxide targets made of NiO. However, in this type of technology, the targets are insulating and the use of the radiofrequency or RF mode is necessary—the deposition rate is then much slower than in DC mode and the process cannot be extrapolated to an industrial deposition line.

The aim of the present invention is therefore to alleviate the drawbacks of the targets used in the above processes by providing a nickel oxide ceramic target that allows films of nickel oxide or of nickel oxide alloys to be deposited in an industrial mode by magnetron sputtering in DC mode or in pulsed mode (up to about 400 kHz, preferably 5 to 100 kHz), which is stable and makes it possible to control the stoichiometry of the films deposited.

For this purpose, a subject of the present invention is therefore an essentially ceramic target for a sputtering device, especially for magnetically enhanced sputtering, said target comprising predominantly nickel oxide, characterized in that the nickel oxide $NiO_x$ is oxygen-deficient with respect to the stoichiometric composition.

By virtue of these arrangements, the hysteresis phenomenon does not occur and the characteristics of the film are easy to control.

In preferred embodiments, the invention may optionally also make use of one or more of the following provisions:
  the factor x is strictly less than 1;
  the stoichiometric deficiency stems from the composition of the intimate blend formed by nickel oxide powders and nickel powders;
  the target has an electrical resistivity of less than 10 ohm.cm, preferably less than 1 ohm.cm, and even more preferably less than 0.1 ohm.cm;
  the nickel oxide is alloyed to a minority element;
  an element is a "minority" element when the atomic percentage of the element in question is less than 50%, preferably less than 30% and even more preferably still less than 20%, calculated with respect to the nickel;
  the minority element is a material whose oxide is an electroactive material with anodic coloration;
  the minority element is chosen from Co, Ir, Ru, and Rh, or a mixture of these elements;
  the minority element is chosen from the elements belonging to the column one of the Periodic Table;
  the minority element is chosen from H, Li, K, and Na, or a mixture of these elements;
  the minority element is a material whose oxide is an electroactive material with cathodic coloration;
  the minority element is chosen from Mo, W, Re, Sn, In, and Bi, or a mixture of these elements;
  the minority element is a metal or an alkaline earth or a semiconductor, the hydrated or hydroxylated oxide of which is protonically conductive; and
  the minority element is chosen from Ta, Zn, Zr, Al, Si, Sb, U, Be, Mg, Ca, V, and Y, or a mixture of these elements.

According to another aspect, a subject of the invention is also a process for manufacturing a thin layer based on nickel oxide by magnetically enhanced sputtering from a ceramic target as described above.

According to yet another aspect, a subject of the invention is also use of the above process for producing an electrochromic material having anodic coloration as a thin layer based on nickel oxide.

According to yet another aspect, a subject of the invention is also an electrochromic device comprising at least one carrier substrate provided with a stack of functional layers, including at least one electrochemically active layer, capable of reversibly and simultaneously inserting ions, of the $H^+$, $Li^+$ or $OH^-$ type, and electrons, said electrochemically active layer being based on nickel oxide obtained by the above process and/or from a target as referred to above.

Other features and advantages of the invention will become apparent over the course of the following description of several of its embodiments, these being given by way of non-limiting example. In the figures.

Figure 1:
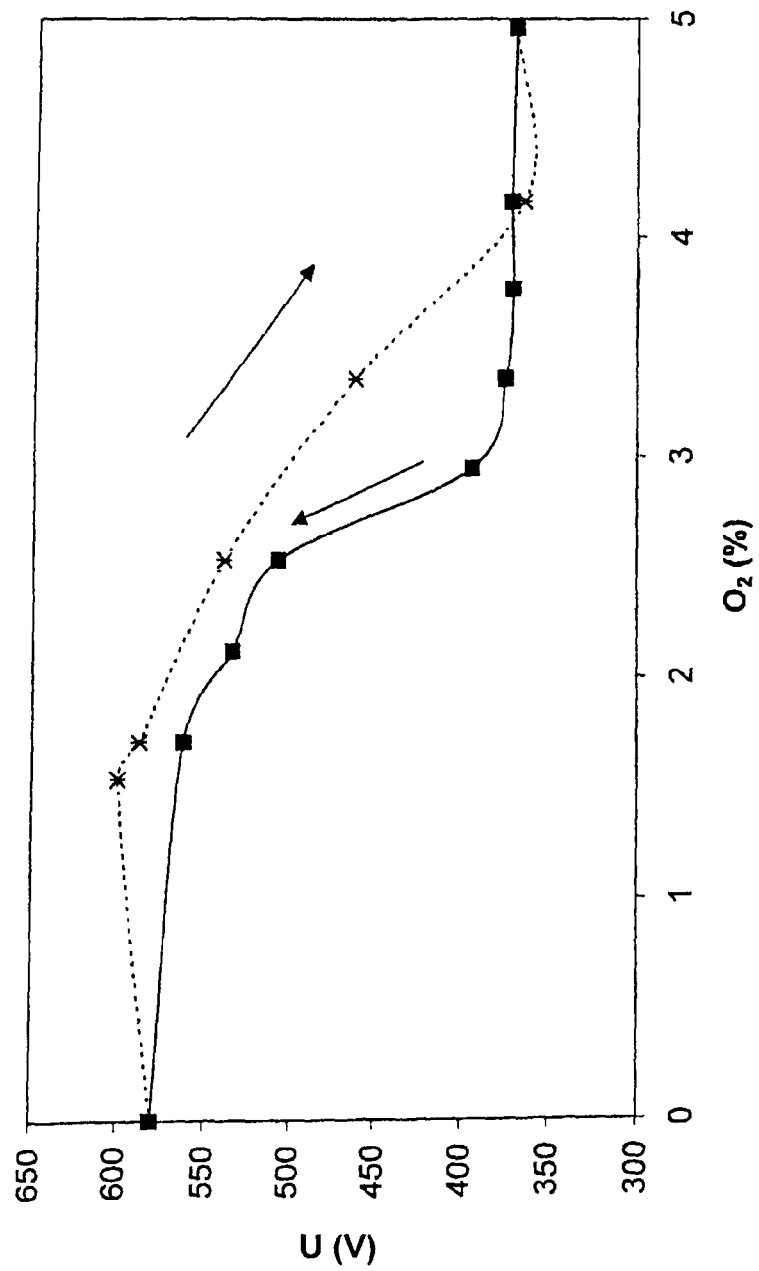
FIG. 1 is a hysteresis curve obtained with a nickel metal target.

According to a preferred method of producing the ceramic targets forming the subject of the invention, they are produced by spray-coating nickel oxide powders onto a metal substrate (e.g. copper) in an oxygen-depleted neutral atmosphere or in a reducing atmosphere.

According to another embodiment, the ceramic targets are produced by co-spray-coating nickel oxide and nickel metal targets onto a metal substrate in a neutral atmosphere or in a reducing atmosphere or in an oxygen-depleted atmosphere.

According to yet another embodiment, these ceramic targets are obtained by intimately blending nickel oxide powder with nickel metal powder in a proportion that varies between 70/30 and 95/5, preferably between 80/20 and 90/10, and that is more preferably 85/15.

The nickel oxide or nickel oxide/nickel powder blend is spray-coated onto a metal substrate in a neutral atmosphere or in a reducing atmosphere or in an oxygen-depleted atmosphere. The nickel oxide powders may be "green" nickel oxide or "black" nickel oxide. It is also possible to sinter a reduced powder blend or even an intimate nickel oxide/nickel blend. It is also possible to use an intimate blend of "green" and "black" nickel oxide powders.

Finally, according to yet another embodiment of the ceramic targets forming the subject of the invention, a minority element is combined with the majority element formed of nickel oxide and/or nickel.

Within the context of the invention, an element is a "minority" element when the atomic percentage of the element in question is less than 50%, preferably less than 30% and even more preferably still less than 20%, calculated with respect to the nickel.

This minority element may be chosen either from elements whose oxide is an electroactive material with anodic coloration, such as for example Co, Ir, Ru, and Rh, or from those belonging to the column one of the Periodic Table (for example H, Li, K, and Na). This minority element may be used by itself or as a mixture.

According to another variant, the minority element is a material whose oxide is an electroactive material with cathodic coloration, and in this case the minority element is chosen from Mo, W, Re, Sn, In and Bi, or a mixture of these elements.

According to yet another variant, the minority element is a metal or an alkaline earth or a semiconductor, the hydrated or hydroxylated oxide of which is protonically conductive, and in this case the minority element is chosen from Ta, Zn, Zr, Al, Si, Sb, U, Be, Mg, Ca, V and Y, or a mixture of these elements.

Whatever the embodiment used, the nickel oxide $NiO_x$ is oxygen-deficient as indicated by the factor x with respect to the stoichiometric composition NiO, x being strictly less than 1, and the ceramic target has an electrical resistivity, at room temperature, that is less than 10 ohm.cm, preferably less than 1 ohm.cm and even more preferably less than 0.1 ohm.cm.

Within the context of the invention, the substoichiometry is calculated with respect to the NiO compound.

These ceramic targets may be planar targets, rotary targets or planar targets used in "twin-mag"™ mode.

The oxygen substoichiometry provides sufficient electrical conductivity to allow said targets to be supplied in DC or pulsed mode. The electrical conductivity is provided by the presence of oxygen vacancies or by an intimate blend of nickel oxide and nickel metal. The lack of stoichiometry may also stem from the composition of the intimate blend formed by nickel oxide powders and nickel powders.

It is possible to deposit, on substrates, especially of the glass type, thin nickel oxide films or layers from these nickel oxide ceramic targets.

The procedure is as follows:

An $NiO_x$ ceramic target according to the invention is mounted on a magnetron sputtering stand. The sputtering is preferably carried out with, as plasma gas, argon, nitrogen, oxygen, an argon/oxygen mixture, an argon/oxygen/hydrogen mixture, an oxygen/hydrogen mixture, a nitrogen/oxygen mixture, a nitrogen/oxygen/hydrogen mixture or a mixture of these with rare gases.

Depending on the proportion of oxygen with respect to argon, the stoichiometry of the deposited film is modified as is its light transmission. A preferred gas mixture for depositing a stoichiometric nickel oxide film contains 60-99% argon by volume and 40-1% oxygen by volume. The total gas pressure in the chamber may be between $2\times10^{-3}$ mbar and $50\times10^{-3}$ mbar.

For electrochromic applications, the substrate on which the nickel oxide film is deposited may be a glass covered with a conductive material, such as a transparent conductive oxide (TCO) or a metal, or a plastic film covered with a transparent conductive oxide. The TCO may be tin-doped indium oxide, commonly called ITO, or fluorine-doped tin oxide.

In the case of a glass covered with a TCO, an underlayer may be deposited between the glass and the TCO. The underlayer serves as a non-coloring layer and is also a barrier to migration of alkali metal ions. This is, for example, a layer of silicon oxide, a layer of silicon oxycarbide or a layer of nitrided silicon oxide or a layer of silicon nitride or of yttrium oxide. Thereafter, the other layers making up an electrochromic stack will be deposited by reactive magnetron sputtering. It is thus possible to produce stacks of the glass/$SiO_2$/ITO/$NiO_x$/electrolyte/$WO_3$/ITO type. The electrolyte has the property of being a medium exhibiting a high ionic conductivity but of being an electronic insulator. It may be tantalum oxide, silicon oxide or a silicon oxynitride or silicon nitride, a bilayer of electrolytic materials, such as tungsten oxide and tantalum oxide or titanium oxide or tantalum oxide, or any other compounds having these properties. As regards the invention, it is also possible to consider as substrate any substrate on which a multilayer stack will have been deposited beforehand so as to produce an electrochromic device. Thus, the multilayer stack may be glass/$SiO_2$/ITO/$WO_3$/electrolyte/$NiO_x$/ITO.

Two examples of targets will be given below, one (Example 1) being a nickel oxide metal target according to the prior art and the other (Example 2) being a ceramic target based on substoichiometric nickel oxide (according to the invention).

EXAMPLE 1

A nickel metal target having the dimensions of 90 mm×210 mm was mounted on a magnetron sputtering stand. The substrate was a glass covered with an $SiO_2$/ITO bilayer having a resistance per square of about 15 ohms. Its light transmission (average value integrated over the range of visible wavelengths) was greater than 85%.

The target was supplied in DC mode at a pressure of $40\times10^{-3}$ mbar. The plasma gas was an argon/oxygen mixture containing 3.5% oxygen by volume. A smaller amount of oxygen switched the deposition from oxide mode to metal mode. This behavior is characteristic of the operation of metal targets during active sputtering. A nickel oxide film 100 nm in thickness was deposited on the substrate. Its light transmission was 63% (Table 1).

EXAMPLE 2

A nickel oxide ceramic planar target having dimensions of 90 mm×210 mm was mounted on a magnetron sputtering stand. Films were deposited on a glass coated with an $SiO_2$/ITO bilayer.

The target was supplied in DC mode at a pressure of $40 \times 10^3$ mbar. The plasma gas was an argon/oxygen mixture in a proportion that varied between 1% and 4% oxygen by volume. The process was stable whatever the amount of oxygen. Table 1 indicates the characteristics of the films after deposition.

TABLE 1

| Target | Amount of oxygen in the plasma gas (vol %) | Thickness (nm) | $T_L$ (%) |
|---|---|---|---|
| Ni (Example 1) | 3.4 | 100 | 63 |
| $NiO_{x (Example\ 2)}$ | 1.0 | 110 | 72 |
| $NiO_{x (Example\ 2)}$ | 2.1 | 90 | 64 |
| $NiO_{x (Example\ 2)}$ | 3.2 | 80 | 61 |

The use of the $NiO_x$ ceramic target enabled the characteristics of the deposited film to be controlled, and in particular its light transmission. The deposition was carried out in DC mode in a stable manner. In addition, compared to a conventional metal target, the photomagnetism of the target was greatly reduced.

Plotted in FIG. 1 is the voltage on the nickel metal target as a function of the oxygen concentration in the chamber. It may be seen that, at low oxygen concentrations, the voltage is high and the film deposited has a metallic nature. At high oxygen concentrations, the voltage is low and the film is of the oxidized type. The transition between the two regimes takes place abruptly, with a hysteresis phenomenon.

Figure 2:
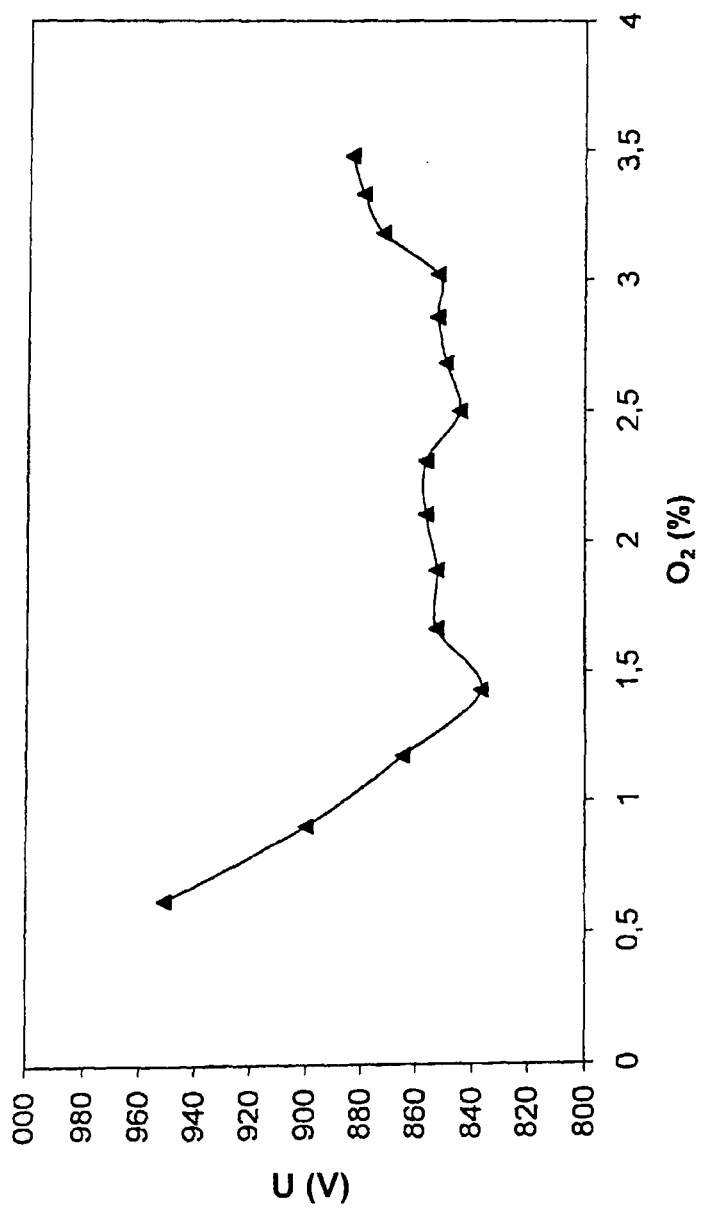
FIG. 2 is a characteristic response curve of a target according to the invention.

Plotted in FIG. 2 is the voltage on the cathode of the target according to the invention as a function of the oxygen concentration in the chamber—the curve shows no appreciable transition and the properties of the deposited film change continuously as a function of the amount of oxygen, thus making it possible to run the process with greater stability, while still guaranteeing optimum control of the properties of the films. This target makes it possible to produce electrochemical devices forming part of electrochromic glazing, especially for buildings or for means of locomotion of the train, airplane or car type, forming part of display screens, or forming part of electrochromic mirrors.

The invention claimed is:

1. A process for manufacturing an electrochemical device comprising a glass substrate comprising, from the substrate, a layer of a transparent conductive oxide and an electrochemically active layer capable of reversibly and simultaneously inserting ions of the $H^+$, $Li^+$, or $OH^-$, type, and electrons, wherein the electrochemically active layer comprises predominantly nickel oxide, the process comprising:
   (I) spray-coating nickel oxide powder or co-spray-coating nickel oxide powder and nickel powder onto a metal substrate, to obtain a ceramic, spray-coated target comprising predominately nickel oxide $NiO_x$, wherein the nickel oxide $NiO_x$ of the target is oxygen-deficient with respect to the stoichiometric composition NiO such that x is less than 1, and wherein the target has an electrical resistivity of less than 10 ohm.cm; and then
   (II) magnetically enhanced sputtering the target comprising predominantly nickel oxide $NiO_x$ onto a glass substrate comprising a layer of a transparent conductive oxide, to obtain the glass substrate comprising, from the substrate, the layer of the transparent conductive oxide and the electrochemically active layer comprising predominantly nickel oxide.

2. The process as claimed in claim 1, wherein the target has an electrical resistivity of less than 1 ohm.cm.

3. The process as claimed in claim 1, wherein the target has an electrical resistivity of less than 0.1 ohm.cm.

4. The process as claimed in claim 1, comprising spray-coating the nickel oxide powder onto the metal substrate.

5. The process as claimed in claim 1, comprising co-spray-coating the nickel oxide powder and the nickel powder onto the metal substrate.

6. The process as claimed in claim 1, wherein the electrochemically active layer comprising predominantly nickel oxide is oxygen deficient with respect to the stoichiometric composition NiO.

7. The process as claimed in claim 1, wherein the electrochemical device further comprises, between the glass substrate and the transparent conductive oxide, an underlayer of silicon oxide, silicon oxycarbide, nitride silicon oxide, silicon nitride, or yttrium oxide.

8. The process as claimed in claim 7, wherein the transparent conductive oxide is tin-doped indium oxide.

9. The process as claimed in claim 7, wherein the transparent conductive oxide is fluorine-coped tin oxide.

10. The process of as claimed in claim 1, wherein the magnetically enhanced sputtering is carried out with a mixture comprising argon and from 1-4% oxygen by volume.

11. The process as claimed in claim 1, wherein the nickel oxide of the target is alloyed to a minority element.

12. The process as claimed in claim 11, wherein the atomic percentage of the minority element is less than 50%, calculated with respect to the amount of nickel present.

13. The process as claimed in claim 11, wherein the minority element is a material whose oxide is an electroactive material with anodic coloration.

14. The process as claimed in claim 13, wherein the minority element is selected from the group consisting of Co, Ir, Ru, Rh, and mixtures thereof.

15. The process as claimed in claim 11, wherein the minority element is a material whose oxide is an electroactive material with cathodic coloration.

16. The process as claimed in claim 15, wherein the minority element is selected from the group consisting of Mo, W, Re, Sn, In, Bi, and a mixture of these elements.

17. The process as claimed in claim 11, wherein the minority element is selected from the elements belonging to the column one of the Periodic Table.

18. The process as claimed in claim 17, wherein the minority element is selected from the group consisting of H, Li, K, and Na.

19. The process as claimed in claim 11, wherein the minority element is a metal or an alkaline earth or a semiconductor, the hydrated or hydroxylated oxide of which is protonically conductive.

20. The process as claimed in claim 19, wherein the minority element is selected from the group consisting of Ta, Zn, Zr, Al, Si, Sb, U, Be, Mg, Ca, V, Y and a mixture of these elements.

21. The process as claimed in claim 11, wherein the atomic percentage of the minority element is less than 30%, calculated with respect to the amount of nickel present.

22. The process as claimed in claim 11, wherein the atomic percentage of the minority element is less than 20%, calculated with respect to the amount of nickel present.

* * * * *